US012754245B2

(12) United States Patent
Lander et al.

(10) Patent No.: US 12,754,245 B2
(45) Date of Patent: Oct. 6, 2026

(54) BATTERY SYSTEM, METHOD FOR DIAGNOSING A BATTERY SYSTEM

(71) Applicant: Robert Bosch GmbH, Stuttgart (DE)

(72) Inventors: Boris Lander, Stuttgart (DE); Chrysanthos Tzivanopoulos, Grossbettlingen (DE); Peter Kohn, Stuttgart (DE); Thomas Barabas, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 466 days.

(21) Appl. No.: 18/468,282

(22) Filed: Sep. 15, 2023

(65) Prior Publication Data

US 2024/0103087 A1 Mar. 28, 2024

(30) Foreign Application Priority Data

Sep. 19, 2022 (DE) ..................... 10 2022 209 822.6

(51) Int. Cl.
*G01R 31/3835* (2019.01)
*G01R 31/12* (2020.01)

(52) U.S. Cl.
CPC ..... *G01R 31/3835* (2019.01); *G01R 31/1263* (2013.01)

(58) Field of Classification Search
CPC ........................ G01R 31/3835; G01R 31/1263
See application file for complete search history.

(56) References Cited

U.S. PATENT DOCUMENTS

| | | | | |
|---|---|---|---|---|
| 10,374,444 | B2 * | 8/2019 | Worry | H01M 10/425 |
| 10,632,855 | B2 * | 4/2020 | Comesaña | B60L 3/0069 |
| 12,199,317 | B2 * | 1/2025 | Krieg | B60L 3/0038 |

FOREIGN PATENT DOCUMENTS

| | | | |
|---|---|---|---|
| DE | 102012215619 | A1 | 3/2014 |
| DE | 102013012151 | A1 | 1/2015 |
| DE | 102014117417 | A1 | 6/2016 |
| DE | 102018211625 | A1 | 1/2020 |
| DE | 102020214562 | A1 | 5/2022 |
| WO | 2020126509 | A1 | 6/2020 |

* cited by examiner

*Primary Examiner* — Elias Desta
(74) *Attorney, Agent, or Firm* — Michael Best & Friedrich LLP

(57) ABSTRACT

A battery system having a battery pack with a positive pole, a negative pole, at least one battery cell, and a pack voltage divider, and at least one high-voltage coupling network electrically connectable to the battery pack, having a positive terminal, a negative terminal, and a link voltage divider. The pack voltage divider comprises a first measuring resistance (RM1) and a first measuring switch (SM1) connected to one another between the negative pole and a first reference point, and a second measuring resistance (RM2) and a second measuring switch (SM2) connected to one another between the positive pole and the first reference point. The link voltage divider comprises a third measuring resistance (RM3) connected between the negative terminal and a second reference point, and a fourth measuring resistance (RM4) connected between the positive terminal and the second reference point.

10 Claims, 2 Drawing Sheets

BATTERY SYSTEM, METHOD FOR DIAGNOSING A BATTERY SYSTEM

BACKGROUND

The invention relates to a battery system comprising a battery pack having a positive pole, a negative pole, at least one battery cell, and a pack voltage divider, and at least one high-voltage coupling network electrically connectable to the battery pack, having a positive terminal, a negative terminal, and a link voltage divider.

The invention also relates to a method for diagnosing a battery system.

It is becoming apparent that electrically driven motor vehicles will increasingly be used in the future. In such electric vehicles, rechargeable batteries are used, predominantly to supply electrical propulsion devices with electrical power.

A battery pack can comprise a plurality of battery cells, which can be electrically interconnected in series or in parallel. Such a battery pack has an output voltage in the range of, for example, 400 V to 800 V, which lies between a positive pole and a negative pole. Further, a management system is provided, which monitors and controls the operation of the battery pack such that the battery cells operate safely and sustainably in terms of their service life. Insulation resistances are also monitored. An insulation monitoring function of the management system typically measures potentials only within high-voltage coupling networks, i.e., coupling networks separated by galvanic isolation from high current lines.

Document DE 10 2013 012 151 A1 discloses a measuring arrangement for measuring insulation resistances, with a voltage source, the output of which is coupled to a first network comprising an electrical insulation.

Document DE 10 2012 215 619 A1 describes a measuring device for measuring the insulation resistance of a galvanic isolation arranged between a low-voltage network and a high-voltage network.

Document DE 10 2018 211 625 A1 relates to an on-board network arrangement having a first insulation resistance between a first high-voltage potential and a predetermined electrical ground and a second insulation resistance between a second high-voltage potential and the predetermined electrical ground. The document also relates to a method for monitoring an on-board network symmetry.

SUMMARY

A battery system is proposed. The battery system comprises a battery pack having a positive pole, a negative pole, at least one battery cell, and a pack voltage divider, and at least one high-voltage coupling network, electrically connectable to the battery pack, having a positive terminal, a negative terminal, and a link voltage divider. The battery system can also comprise a low-voltage coupling network. To separate the battery pack or the high-voltage coupling network from the low-voltage coupling network, the battery system further comprises insulation resistances, for example a first and a second pack insulation resistance, as well as a first and a second link insulation resistance. The insulation resistances are electrically connected to a low-voltage coupling network ground. The term "insulation resistance" in the context of the present invention rather means the entirety of the parasitic resistances between the corresponding potentials. The first pack insulation resistance is present between the negative pole and the low-voltage coupling network ground, while the second pack insulation resistance is present between the positive pole and the low-voltage coupling network ground. The first link insulation resistance is present between the negative terminal and the low-voltage coupling network ground, while the second link insulation resistance is present between the positive terminal and the low-voltage coupling network ground.

The pack voltage divider comprises a first measuring resistance and a first measuring switch serially connected to one another between the negative pole and a first reference point, and a second measuring resistance and a second measuring switch serially connected to one another between the positive pole and the first reference point.

The link voltage divider comprises a third measuring resistance connected between the negative terminal and a second reference point and a fourth measuring resistance connected between the positive terminal and the second reference point.

The battery system further comprises a first measuring unit for measuring a first measuring voltage dropping at the first measuring resistance, a second measuring unit for measuring a second measuring voltage dropping on the second measuring resistance, a third measuring unit for measuring a third measuring voltage dropping at the third measuring resistance, and a fourth measuring unit for measuring a fourth measuring voltage dropping at the fourth measuring resistance. The first and second measuring units are electrically connected to the first reference point, and the third and fourth measuring units are electrically connected to the second reference point.

According to the invention, the first reference point is connected to the low-voltage coupling network ground and the second reference point is connected to the negative pole of the battery pack.

Preferably, the battery pack is electrically connectable to the at least one high-voltage coupling network by means of at least one switch and/or a DC/DC converter.

Preferably, the first, the second, the third, and the fourth measuring units are configured as analog-digital converters.

Preferably, the first and the second measuring units are arranged within the battery pack.

Preferably, the third and fourth measuring units are also arranged within the battery pack.

Preferably, the at least one high-voltage coupling network is configured as a traction network for traction of a vehicle or a charging network for charging the battery pack.

A further aspect of the invention is to provide a method for diagnosing a battery system. The method according to the invention is preferably carried out using the battery system proposed according to the invention. Accordingly, features described in the context of the battery system apply to the method, and vice versa, features described in the context of the method apply to the battery system.

When the battery pack is disconnected from the at least one high-voltage coupling network, the respective measuring voltages are sensed by means of the respective measuring units at different switch positions of the first and second measuring switches. The insulation resistances are then calculated.

When the battery pack is connected to the at least one high-voltage coupling network, then the first and second measuring voltages are sensed by means of the corresponding first and second measuring units at different switch positions of the first and second measuring switches. Thereafter, the insulation resistances are calculated.

The phrase "different switch positions of the first and the second measuring switch" is understood to mean that, for example, the two measuring switches are closed or open or that one of the measuring switches is closed while the other measuring switch is open.

Furthermore, an on-board network for a vehicle, in particular an electrically driven vehicle, is proposed. The on-board network comprises a battery system according to the invention and/or is configured so as to carry out the method proposed according to the invention.

A vehicle, in particular an electrically driven vehicle, which comprises an on-board power supply according to the invention, is also proposed.

With the present invention, a new structure for insulation measurement is provided, which also allows insulation measurement in coupling networks that are galvanically isolated in the high-current path or, for example, are located at another high-voltage position during charging by a high-voltage DC/DC converter, to diagnose with respect to their insulation resistance.

This new structure or method for determining insulation resistances can also be used in order to plausibly check the measurement or to gain advantages in the speed of the measurement. The latter is particularly important when the relaxation times are very different from the stationary state for the different equations.

BRIEF DESCRIPTION OF THE DRAWINGS

Embodiments of the invention are explained in greater detail with reference to the drawings and the following description.

Shown are.

DETAILED DESCRIPTION

In the following description of the embodiments of the invention, identical or similar elements are denoted by identical reference numbers, wherein a repeated description of these elements is omitted in individual cases. The figures illustrate the subject-matter of the invention merely schematically.

Figure 1:
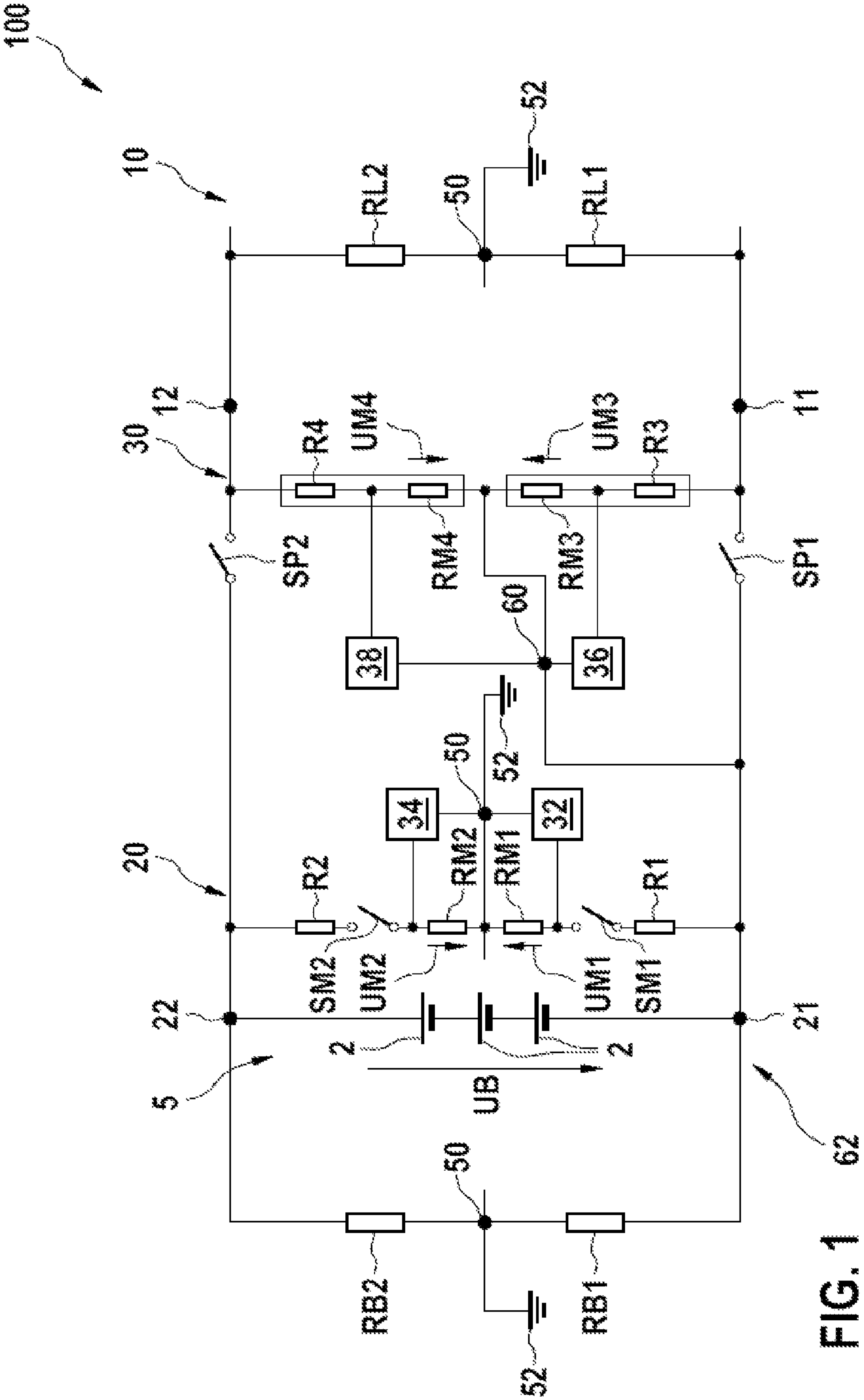
FIG. 1 a schematic representation of a battery disconnect unit according to a first embodiment and FIG. 2 a schematic representation of a battery disconnect unit according to a second embodiment.

FIG. 1 shows a battery system 100 according to the invention according to a first embodiment.

The battery system 100 comprises a battery pack 5, which has a positive pole 22, a negative pole 21, multiple battery cells 2, and a pack voltage divider 20. The battery pack 5 has a pack voltage UB. In the present case, in FIG. 1, three battery cells 2 connected in series are shown. Of course, the battery pack 5 can comprise fewer than or more than three battery cells 2. The multiple battery cells 2 are preferably configured as lithium ion cells and can also be parallel or serial and/or connected in parallel.

The battery system 100 further comprises a high-voltage coupling network 10 electrically connectable to the battery pack 5, having a positive terminal 12, a negative terminal 11, and a link voltage divider 30. The link voltage divider 30 comprises a series connection of a plurality of ohmic resistances in order to share a high voltage on the on-board network side, for example of a vehicle and/or a charging column, in such a way that it can be sensed with an analog-digital converter. From FIG. 1, it can be seen that the battery pack 5 is electrically connectable to the high-voltage coupling network 10 via a first switch SP1 and a second switch SP2. The first and the second switches SP1, SP2 are also referred to as main contactor. The battery system 100 can comprise further high-voltage coupling networks 10.

Figure 2:
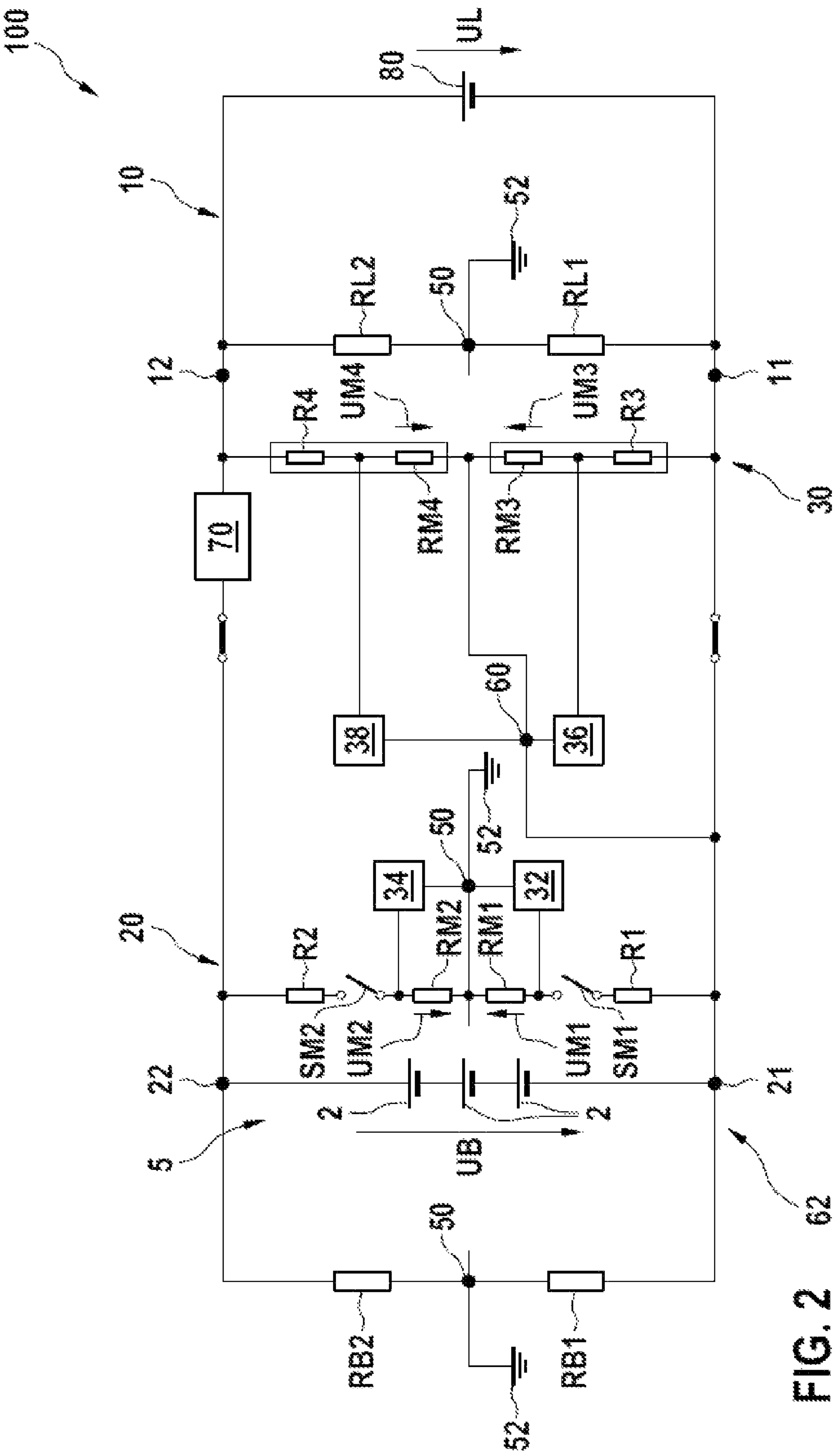

The battery system 100 also comprises a low-voltage coupling network not shown in more detail here. To separate the battery pack 5 or the high-voltage coupling network 10 from the low-voltage coupling network, the battery system 100 further comprises insulation resistances, namely a first pack insulation resistance RB1 and a second pack insulation resistance RB2, as well as a first link insulation resistance RL1 and a second link insulation resistance RL2. The insulation resistances are electrically connected to a low-voltage coupling network ground 52. The insulation resistances RB1, RB2, RL1 RL2 shown in FIG. 1 or FIG. 2 are not electrical components, but rather symbolically represent the entirety of the parasitic resistances between the corresponding potentials.

The first pack insulation resistance RB1 is present between the negative pole 21 and the low-voltage coupling network ground 52, while the second pack insulation resistance RB2 is present between the positive pole 22 and the low-voltage coupling network ground 52. The first link insulation resistance RL1 is present between the negative terminal 11 and the low-voltage coupling network ground 52, while the second link insulation resistance RL2 is present between the positive terminal 12 and the low-voltage coupling network ground 52.

The pack voltage divider 20 comprises a first measuring resistance RM1 and a first measuring switch SM1, which are serially connected to one another between the negative pole 21 and a first reference point 50. The first measuring resistance RM1 is connected directly to the first reference point 50, while the first measuring switch SM1 is connected to the negative pole 21 via a first additional resistance R1.

The pack voltage divider 20 further comprises a second measuring resistance RM2 and a second measuring switch SM2 serially connected to one another between the positive pole 22 and the first reference point 50. The second measuring resistance RM2 is connected directly to the first reference point 50, while the second measuring switch SM2 is connected to the positive pole 22 via a second additional resistance R2.

The link voltage divider 30 comprises a third measuring resistance RM3 connected between the negative terminal 11 and a second reference point 60 and a fourth measuring resistance RM4 connected between the positive terminal 12 and the second reference point 60. A first terminal of the third measuring resistance RM3 is connected directly to the second reference point 60 and a second terminal of the third measuring resistance RM3 is connected to the negative terminal 11 via a third additional resistance R3. A first terminal of the fourth measuring resistance RM4 is connected directly to the second reference point 60, while a second terminal of the fourth measuring resistance RM4 is connected to the positive terminal 12 via a fourth additional resistance R4.

The battery system 100 further comprises a first measuring unit 32 for measuring a first measuring voltage UM1 dropping at the first measuring resistance RM1, a second measuring unit 34 for measuring a second measuring voltage UM2 dropping on the second measuring resistance RM2, a third measuring unit 36 for measuring a third measuring voltage UM3 dropping at the third measuring resistance RM3, and a fourth measuring unit 38 for measuring a fourth measuring voltage UM4 dropping at the fourth measuring resistance RM4. The first and second measuring units 32, 34 are electrically connected to the first reference point 50, and the third and fourth measuring units 36, 38 are electrically connected to the second reference point 60.

FIG. 1 further shows that the first reference point 50 is connected to the low-voltage coupling network ground 52 and the second reference point 60 is connected to the negative pole 21 of the battery pack 5. The negative pole 21 of the battery pack 5 represents a high-voltage coupling network ground 62.

In the present case, in FIG. 1, the first, the second, the third, and the fourth measuring units 32, 34, 36, 38 are configured as analog-digital converters.

The first and the second measuring units 32, 34 can be arranged within the battery pack 5. Also, the third and fourth measuring units 36, 38 can be arranged within the battery pack 5.

When the battery pack 5 is connected to the high-voltage coupling network 10, i.e., the first and second switches SP1, SP2 are closed, then the first and second measuring voltages UM1, UM2 are sensed by means of the corresponding first and second measuring units 32, 34 at different switch positions of the first and second measuring switches SM1, SM2. Next, the pack and link insulation resistances RB1, RB2, RL1, RL2 are calculated.

Firstly, the first and second measuring voltages UM1, UM2 are sensed in a first combination of a first switch position CC, which means that the second measuring switch SM2 is closed and the first measuring switch SM1 is closed, and a second switch position OC, which means that the second measuring switch SM2 is open and the first measuring switch SM1 is closed. The following equations apply:

$$R_{isoP} = R_{meas2}\frac{U_B\left(1 - U_{M1}^{CC} / U_{M1}^{OC}\right)}{\left(U_{M1}^{CC} - U_B\right)}$$

and $$R_{isoN} = \frac{R_{meas1}R_{meas2}U_B\left(U_{M1}^{CC} - U_{M1}^{OC}\right)}{\begin{array}{c}R_{meas1}U_B^2 + R_{meas1}U_{M1}^{CC}U_{M1}^{OC} - R_{meas2}U_{M1}^{CC}U_B - \\ R_{meas1}U_{M1}^{CC}U_B + R_{meas2}U_{M1}^{OC}U_B - R_{meas1}U_{M1}^{OC}U_B\end{array}}$$

Here, $R_{isoP}$ and $R_{isoN}$ are replacement resistances for the parallel connection of the pack and link insulation resistances RB1, RB2, RL1, RL2 on the positive pole 22 as well as on the negative pole 21, where:

$$\frac{1}{R_{isoP}} = \frac{1}{R_{B2}} + \frac{1}{R_{L2}}$$

and $$\frac{1}{R_{isoN}} = \frac{1}{R_{B1}} + \frac{1}{R_{L1}}$$

Here, $R_{meas1}$ is the sum of the first measuring resistance RM1 and the first additional resistance R1, $R_{meas2}$ is the sum of the second measuring resistance RM2 and the second additional resistance R2, $U_{M1}^{CC}$ is the first measuring voltage UM1 at the first switch position CC, and $U_{M1}^{OC}$ is the first measuring voltage UM1 at the second switch position OC.

Analogously, the voltages are measured for a second combination of the first switch position CC and a third switch position CO, which means that the second measuring switch SM2 is closed and the first measuring switch SM1 is open:

$$R_{isoP} = \frac{R_{meas1}R_{meas2}U_B\left(U_{M2}^{CC} - U_{M2}^{CO}\right)}{\begin{array}{c}R_{meas2}U_B^2 + 1U_{M2}^{CC}U_{M2}^{CO} - R_{meas2}U_{M2}^{CC}U_B - \\ R_{meas1}U_{M2}^{CC}U_B - R_{meas2}U_{M2}^{CO}U_B + R_{meas1}U_{M2}^{CO}U_B\end{array}}$$

and $$R_{isoN} = R_{meas1}\frac{U_B\left(1 - U_{M2}^{CC} / U_{M2}^{CO}\right)}{\left(U_{M2}^{CC} - U_B\right)}$$

Here, $U_{M2}^{CC}$ is the second measuring voltage UM2 at the first switch position CC, and $U_{M2}^{CO}$ is the second measuring voltage UM2 at the third switch position CO.

The equation system can also be solved for a third combination of the second switch position OC and the third switch position CO, which is not shown in further detail here.

When the battery pack 5 is disconnected from the high-voltage coupling network 10, i.e., the first and second switches SP1, SP2 are opened, the respective measuring voltages UM1, UM2, UM3, UM4 are sensed by means of the respective measuring units 32, 34, 36, 38 at different switch positions of the first and second measuring switches SM1, SM2. Then, the pack and link insulation resistances RB1, RB2, RL1, RL2 are calculated.

The pack and link insulation resistances RB1, RB2, RL1, RL2 can be determined separately.

For example, for the first combination of the first switch position CC and the second switch position OC, the following system of equations applies:

$$R_{B2} = R_{isoP}$$

$$R_{L2} = R_{meas3}\left[\frac{U_{M1}^{OC}}{U_{M3}^{OC}} - 1\right]$$

$$R_{L1} = R_{meas4}\left[\frac{U_{M1}^{OC}}{U_{M4}^{OC}} - 1\right]$$

$$R_{B1} = \frac{1}{\frac{1}{R_{isoN}} - \frac{1}{R_{L2} + R_{meas3}} - \frac{1}{R_{L1} + R_{meas4}}}$$

Here, $R_{meas3}$ is the sum of the third measuring resistance RM3 and the third additional resistance R3, $R_{meas4}$ is the sum of the fourth measuring resistance RM4 and the fourth additional resistance R4, $U_{M3}^{OC}$ is the third measuring voltage UM3 at the second switch position OC, and $U_{M4}^{OC}$ is the fourth measuring voltage UM4 at the second switch position OC.

The replacement resistances $R_{isoP}$, $R_{isoN}$ can be calculated the same as above for the first combination of the first switch position CC and the second switch position OC for the closed first and second switches SP1, SP2.

The equations can be similarly derived in the second combination of the first switch position CC and the third switch position CO, as well as in the third combination of the second switch position OC and the third switch position CO.

FIG. 2 schematically shows the battery system 100 according to the invention according to a second embodiment. The battery system 100 shown in FIG. 2 differs from the battery system 100 shown in FIG. 1 in that the battery pack 5 in FIG. 2 is electrically connected to the high-voltage coupling network 10 by means of a DC/DC converter 70, which is connected to a charging column 80, which in the present case is shown in FIG. 2 as a battery cell 2, for charging the battery pack 5. The charging column 80 has a charging voltage UL, which is less than the pack voltage UB of the battery pack 5. For example, the charging voltage UL is equal to 400 V, while the pack voltage UB is equal to 800 V.

Assuming that the measuring resistances RM1, RM2, RM3, RM4 are approximately uniformly sized, or that the additional resistances R1, R2, R3, R4 are approximately uniformly sized, a sum of the conductivity of the pack and link insulation resistances RB1, RB2, RL1, RL2 can be determined.

The following applies:

$$G_{total} = G_{meas}\left[\frac{U_B}{U_B - U_{M1}^{OC} - U_{M2}^{CO}} - 1\right]$$

Here, $G_{meas}$ is the electrical conductivity of the respective measuring chains, as the reciprocal value of the electrical resistance $R_{meas}$ of the respective measuring chains. $R_{meas}$ is further defined as above for the four different measuring chains by means of the respective measuring resistances RM1, RM2, RM3, RM4.

Here, the definition $$G_{total} = G_{B1} + G_{L1} + G_{B2} + G_{L2}$$

is used, where $$G_{B1} = \frac{1}{R_{B1}},\ G_{L1} = \frac{1}{R_{L1}},\ G_{B2} = \frac{1}{R_{B2}},\ G_{L2} = \frac{1}{R_{L2}}$$

and $$G_{meas} = \frac{1}{R_{meas}} = \frac{1}{R_1 + R_{M1}} = \frac{1}{R_2 + R_{M2}} = \frac{1}{R_3 + R_{M3}} = \frac{1}{R_4 + R_{M4}}$$

Should one of the pack and link insulation resistances RB1, RB2, RL1, RL2 drop, this can be determined in an increase of the sum $G_{total}$ of the conductivity of the pack and link insulation resistances RB1, RB2, RL1, RL2. A localization of the error, i.e., the separate measuring of the individual insulation resistances, is only possible after the fact. For example, the insulation resistances can be calculated via the equation system stated above.

The invention is not limited to the embodiment examples described here and the aspects highlighted therein. Rather, within the range specified by the claims, a large number of modifications are possible which lie within the abilities of a person skilled in the art.

The invention claimed is:

1. A battery system (100) comprising a battery pack (5) having a positive pole (22), a negative pole (21), at least one battery cell (2), and a pack voltage divider (20), and at least one high-voltage coupling network (10) electrically connectable to the battery pack (5), having a positive terminal (12), a negative terminal (11), and a link voltage divider (30), wherein the pack voltage divider (20) comprises:

a first measuring resistance (RM1) and a first measuring switch (SM1) serially connected to one another between the negative pole (21) and a first reference point (50), and a second measuring resistance (RM2) and a second measuring switch (SM2) serially connected to one another between the positive pole (22) and the first reference point (50), wherein the pack voltage divider (30) comprises:

a third measuring resistance (RM3) connected between the negative terminal (11) and a second reference point (60), and a fourth measuring resistance (RM4) connected between the positive terminal (12) and the second reference point (60), and wherein the battery system (100) further comprises a first measuring unit (32) for measuring a first measuring voltage (UM1) dropping at the first measuring resistance (RM1), a second measuring unit (34) for measuring a second measuring voltage (UM2) dropping on the second measuring resistance (RM2), a third measuring unit (36) for measuring a third measuring voltage (UM3) dropping at the third measuring resistance (RM3), and a fourth measuring unit (38) for measuring a fourth measuring voltage (UM4) dropping at the fourth measuring resistance (RM4), wherein the first measuring unit (32) and the second measuring unit (34) are electrically connected to the first reference point (50), and the third measuring unit (36) and the second measuring unit (38) are electrically connected to the second reference point (60), wherein the first reference point (50) is connected to a low-voltage coupling network ground (52), and that the second reference point (60) is connected to the negative pole (21) of the battery pack (5).

2. The battery system (100) according to claim 1, wherein the battery pack (5) is electrically connectable to the at least one high-voltage coupling network (10) by means of at least one switch (SP1, SP2) and/or one DC/DC converter (70).

3. The battery system (100) according to claim 1, wherein the first measuring unit (32), the second measuring unit (34), the third measuring unit (36), and the fourth measuring units (38) are configured as analog-digital converters.

4. The battery system (100) according to claim 1, wherein the first measuring unit (32) and the second measuring unit (34) are arranged within the battery pack (5).

5. The battery system (100) according to claim 1, wherein, the third measuring unit (36) and the fourth measuring unit (38) are arranged within the battery pack (5).

6. The battery system (100) according to claim 1, wherein the at least one high-voltage coupling network (10) is configured as a traction network or a charging network.

7. A method for diagnosing a battery system (100) that includes a battery pack (5) having a positive pole (22), a negative pole (21), at least one battery cell (2), and a pack voltage divider (20), and at least one high-voltage coupling network (10) electrically connectable to the battery pack (5), having a positive terminal (12), a negative terminal (11), and a link voltage divider (30), wherein the pack voltage divider (20) comprises:

a first measuring resistance (RM1) and a first measuring switch (SM1) serially connected to one another between the negative pole (21) and a first reference point (50), and a second measuring resistance (RM2) and a second measuring switch (SM2) serially connected to one another between the positive pole (22) and the first reference point (50), wherein the pack voltage divider (30) comprises:

a third measuring resistance (RM3) connected between the negative terminal (11) and a second reference point (60), and a fourth measuring resistance (RM4) connected between the positive terminal (12) and the second reference point (60), and wherein the battery system (100) further comprises a first measuring unit (32) for measuring a first measuring voltage (UM1) dropping at the first measuring resistance (RM1), a second measuring unit (34) for measuring a second measuring voltage (UM2) dropping on the second measuring resistance (RM2), a third measuring unit (36) for measuring a third measuring voltage (UM3) dropping at the third measuring resistance (RM3), and a fourth measuring unit (38) for measuring a fourth measuring voltage (UM4) dropping at the fourth measuring resistance (RM4), wherein the first measuring unit (32) and the second measuring unit (34) are electrically connected to the first reference point (50), and the third measuring unit (36) and the fourth measuring unit (38) are electrically connected to the second reference point (60), wherein the first reference point (50) is connected to a low-voltage coupling network ground (52), and that the second reference point (60) is connected to the negative pole (21) of the battery pack (5),, the method comprising:

capturing respective measuring voltages (UM1, UM2, UM3, UM4) by means of respective measuring units (32, 34, 36, 38) at different switch positions of the first measuring switch (SM1) and the second measuring switch (SM2); and calculating insulation resistances (RB1, RB2, RL1, RL2).

8. The method according to claim 7, further comprising:

capturing the first measuring voltage (UM1) and the second measuring voltage (UM2) by means of the respective the first measuring unit (32) and the second measuring unit (34) at different switch positions of the first measuring switch (SM1) and the second measuring switch (SM2);

calculating the insulation resistances (RB1, RB2, RL1, RL2).

9. An on-board network comprising a battery system (100) that includes:

a battery pack (5) having a positive pole (22), a negative pole (21), at least one battery cell (2), and a pack voltage divider (20), and at least one high-voltage coupling network (10) electrically connectable to the battery pack (5), having a positive terminal (12), a negative terminal (11), and a link voltage divider (30), wherein the pack voltage divider (20) comprises:

a first measuring resistance (RM1) and a first measuring switch (SM1) serially connected to one another between the negative pole (21) and a first reference point (50), and a second measuring resistance (RM2) and a second measuring switch (SM2) serially connected to one another between the positive pole (22) and the first reference point (50), wherein the pack voltage divider (30) comprises:

a third measuring resistance (RM3) connected between the negative terminal (11) and a second reference point (60), and a fourth measuring resistance (RM4) connected between the positive terminal (12) and the second reference point (60), and wherein the battery system (100) further comprises a first measuring unit (32) for measuring a first measuring voltage (UM1) dropping at the first measuring resistance (RM1), a second measuring unit (34) for measuring a second measuring voltage (UM2) dropping on the second measuring resistance (RM2), a third measuring unit (36) for measuring a third measuring voltage (UM3) dropping at the third measuring resistance (RM3), and a fourth measuring unit (38) for measuring a fourth measuring voltage (UM4) dropping at the fourth measuring resistance (RM4), wherein the first measuring unit (32) and the second measuring unit (34) are electrically connected to the first reference point (50), and the third measuring unit (36) and the fourth measuring unit (38) are electrically connected to the second reference point (60), wherein the first reference point (50) is connected to a low-voltage coupling network ground (52), and that the second reference point (60) is connected to the negative pole (21) of the battery pack (5).

10. A vehicle comprising an on-board network according to claim 9.

* * * * *